United States Patent
Oh et al.

(10) Patent No.: US 9,496,479 B2
(45) Date of Patent: Nov. 15, 2016

(54) VIBRATOR

(71) Applicant: SAMSUNG ELECTRO-MECHANICS CO., LTD., Suwon-si (KR)

(72) Inventors: Hwa Young Oh, Suwon-si (KR); Seung Hyeon Jeong, Suwon-si (KR)

(73) Assignee: MPLUS CO., LTD., Suwon-Si, Gyeonggi-Do (KR)

( * ) Notice: Subject to any disclaimer, the term of this patent is extended or adjusted under 35 U.S.C. 154(b) by 351 days.

(21) Appl. No.: 14/170,476

(22) Filed: Jan. 31, 2014

(65) Prior Publication Data

US 2015/0084485 A1 Mar. 26, 2015

(30) Foreign Application Priority Data

Sep. 23, 2013 (KR) .................. 10-2013-0112589

(51) Int. Cl.
*H01L 41/053* (2006.01)
*B06B 1/06* (2006.01)

(52) U.S. Cl.
CPC ........... *H01L 41/053* (2013.01); *B06B 1/0648* (2013.01)

(58) Field of Classification Search
CPC .................................................... H01L 41/053
USPC .............. 310/323.01, 326, 345; 31/329, 348
See application file for complete search history.

(56) References Cited

U.S. PATENT DOCUMENTS

| 7,692,363 B2 * | 4/2010 | Butler | B06B 1/0603 310/334 |
| 2010/0007244 A1 * | 1/2010 | Fujimoto | H02N 2/163 310/323.06 |
| 2012/0026103 A1 * | 2/2012 | Woo | H02N 2/0055 345/173 |
| 2012/0153775 A1 * | 6/2012 | Park | G06F 3/016 310/326 |
| 2012/0212100 A1 * | 8/2012 | Lee | H01L 41/053 310/317 |

FOREIGN PATENT DOCUMENTS

| JP | 2007014107 A | 1/2007 |
| JP | 2011-206634 | 10/2011 |
| KR | 10-2011-0045486 | 5/2011 |
| KR | 101241030 B1 | 3/2013 |
| KR | 10-1250291 | 4/2013 |

OTHER PUBLICATIONS

Office Action dated Sep. 19, 2014 for Korean Patent Application No. 10-2013-0112589 and its English summary provided by Applicant's foreign counsel.
Office Action dated Mar. 27, 2015 for Korean Patent Application No. 10-2013-0112589 and its English summary provided by Applicant's foreign counsel.

* cited by examiner

*Primary Examiner* — Thomas Dougherty
*Assistant Examiner* — Karen B Addison
(74) *Attorney, Agent, or Firm* — LRK Patent Law Firm

(57) ABSTRACT

There is provided a vibrator including: a housing having an internal space; an elastic member including a housing fixed part fixed to the housing, a piezoelectric element mounted part disposed so as to face the housing fixed part, and a weight body installed part disposed adjacent to the housing fixed part; a piezoelectric element fixed to the piezoelectric element mounted part; and a weight body fixed to the weight body installed part, wherein the elastic member has a closed curve shape.

10 Claims, 4 Drawing Sheets

VIBRATOR

CROSS-REFERENCE TO RELATED APPLICATION

This application claims the benefit of Korean Patent Application No. 10-2013-0112589 filed on Sep. 23, 2013, with the Korean Intellectual Property Office, the disclosure of which is incorporated in its entirety herein by reference.

BACKGROUND

The present disclosure relates to a vibrator.

A vibrator, a component converting electric energy into mechanical vibration using a principle of generating electromagnetic force, is mounted in mobile phones to be used for silently notifying a user of call reception by transferring vibration to the user. In accordance with the rapid growth of mobile phone market and the trend toward addition of multiple functions to the mobile phone, mobile phone components have been required to have a small size and high quality.

In this situation, demand has increased for development of a vibrator having a new structure capable of overcoming disadvantages of an existing vibrator and significantly improving quality.

Meanwhile, as the release of smart phones among mobile phones has rapidly increased, a touch screen scheme has been adopted, such that the vibrator has been used in order to generate vibration at the time of touching a touch screen. Performances particularly required in the vibration generated at the time of touching the touch screen are as follows. First, since the number of vibration generation at the time of touching the touch screen is larger than that of vibration generation at the time of call reception, an operation lifespan should increase. Second, in order to increase user satisfaction when a user feels the vibration at the time of touching the touch screen, a response speed of the vibration should increase in accordance with a touch speed of the touch screen.

A piezo haptic actuator has been used as a product capable of implementing these features. The piezo haptic actuator uses the principle of inverse piezoelectric effect from which displacement is generated when a voltage is applied to a piezo-element, that is, a principle of allowing a weight of a mover to be moved by the generated displacement to generate a vibration force.

A vibrator having the above-mentioned structure has the following features. A bandwidth of a frequency capable of obtaining a vibration force at or above a predetermined level is wide, such that stable vibration characteristics may be implemented, and vibration having low and high frequencies rather than a single frequency in a predetermined frequency range may be variously used. In addition, since the vibrator may implement rapid operation response characteristics, it may be appropriate for implementing haptic vibration of a mobile device such as a mobile phone, or the like.

However, since a length of the piezo-element should be long in order to secure displacement and vibration, the length of the piezo-element increases and the piezo-element becomes vulnerable to drop impact.

RELATED ART DOCUMENT (Patent Document 1) Japanese Patent Laid-Open Publication No. 2011-206634

SUMMARY

An aspect of the present disclosure may provide a vibrator capable of preventing damage to a piezoelectric element caused by external impact.

An aspect of the present disclosure may also provide a vibrator capable of increasing an amount of vibration generated.

According to an aspect of the present disclosure, a vibrator may include: a housing having an internal space; an elastic member including a housing fixed part fixed to the housing, a piezoelectric element mounted part disposed so as to face the housing fixed part, and a weight body installed part disposed adjacent to the housing fixed part; a piezoelectric element fixed to the piezoelectric element mounted part; and a weight body fixed to the weight body installed part, wherein the elastic member has a closed curve shape.

The elastic member may include: a first elastic member including the housing fixed part and a first deformed part extended from the housing fixed part; and a second elastic member including a bonded part bonded to the first deformed part, the piezoelectric element mounted part extended from one side of the bonded part, and the weight body installed part extended from the other side of the bonded part.

The first and second elastic members may be formed integrally with each other or are formed separately from each other and then bonded to each other.

The piezoelectric element may have a hexahedral shape.

The weight body may have an insertion groove formed in an upper surface thereof and may have a coin shape, wherein the insertion groove has the piezoelectric element inserted thereinto at the time of generation of vibration.

The housing may include a case having the internal space and a bracket assembled to a lower end portion of the case, each of the case and the bracket may be provided with protrusion parts at which the piezoelectric element and both end portions of the elastic member are disposed, and each of the case and the bracket may have a circular shape except for the protrusion parts, when viewed from the top.

The elastic member may further include first deformed parts contacting both end portions of the piezoelectric element, the piezoelectric element mounted part may be extended from one end of the first deformed parts, the housing fixed part may be extended from a central portion of the other end of the first deformed part, and weight body fixed parts may be extended from the other end of the first deformed parts so as to be disposed at both sides of the housing fixed part.

The elastic member may further include first deformed parts contacting both end portions of the piezoelectric element, the piezoelectric element mounted part may be extended from one end of the first deformed parts, a weight body fixed part may be extended from a central portion of the other end of the first deformed parts, and the housing fixed parts may be extended from the other end of the first deformed parts so as to be disposed at both sides of the weight body fixed part.

The weight body fixed part may have a width wider than that of the housing fixed part.

According to another aspect of the present disclosure, a vibrator may include: a housing having an internal space; a first elastic member including a housing fixed part and a first deformed part extended from the housing fixed part; a second elastic member including a bonded part bonded to the first deformed part, a piezoelectric element mounted part extended from one side of the bonded part, and a weight body installed part extended from the other side of the bonded part; a piezoelectric element fixed to the piezoelectric element mounted part; and a weight body fixed to the weight body installed part, wherein the housing fixed part and the weight body installed part contact each other or are spaced apart from each other at the time of generation of vibration.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
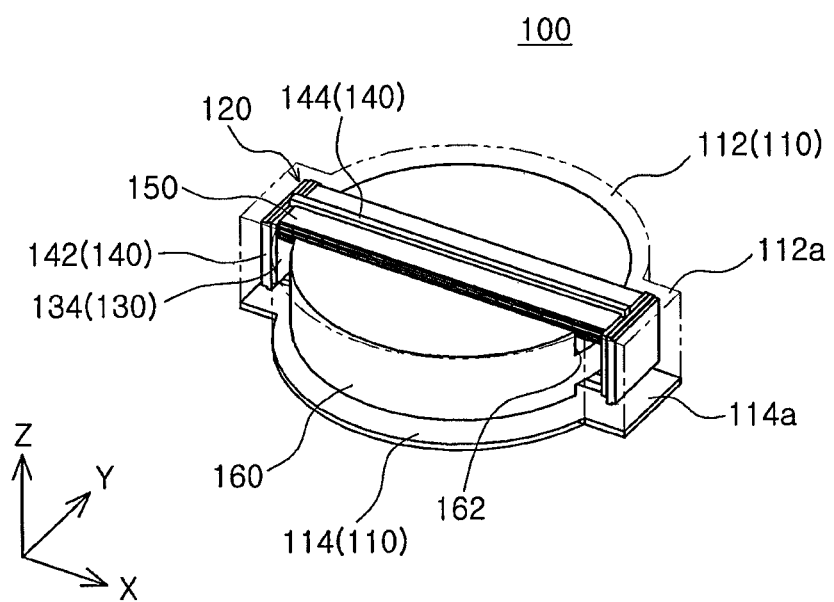
FIG. 1 is a schematic perspective view illustrating a vibrator according to an exemplary embodiment of the present disclosure.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Figure 2:
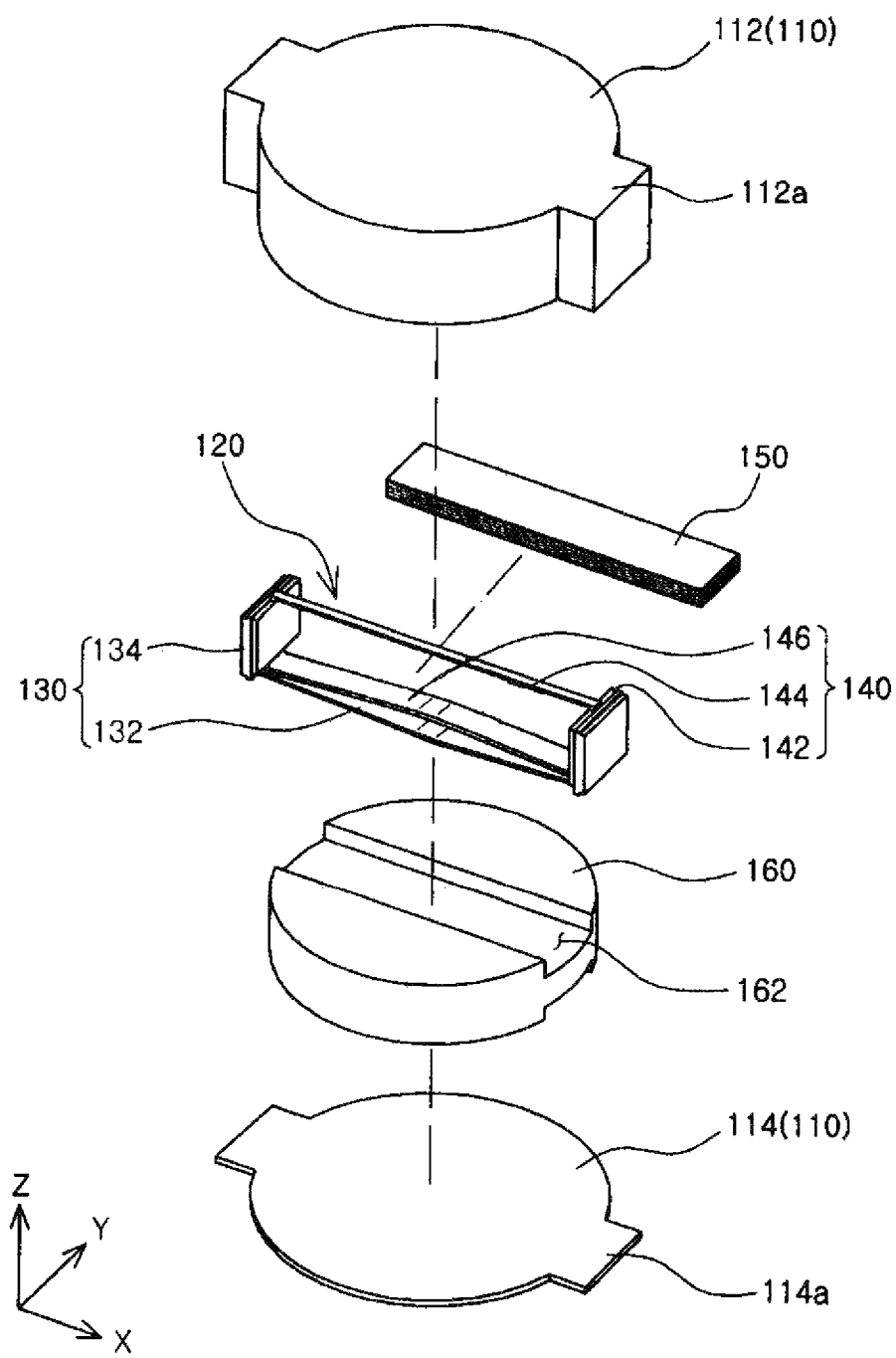
FIG. 2 is an exploded perspective view illustrating the vibrator according to an exemplary embodiment of the present disclosure.

FIG. 1 is a schematic perspective view illustrating a vibrator according to an exemplary embodiment of the present disclosure; FIG. 2 is an exploded perspective view illustrating the vibrator according to an exemplary embodiment of the present disclosure; and FIG. 3 is a schematic cross-sectional view illustrating the vibrator according to an exemplary embodiment of the present disclosure.

Figure 3:
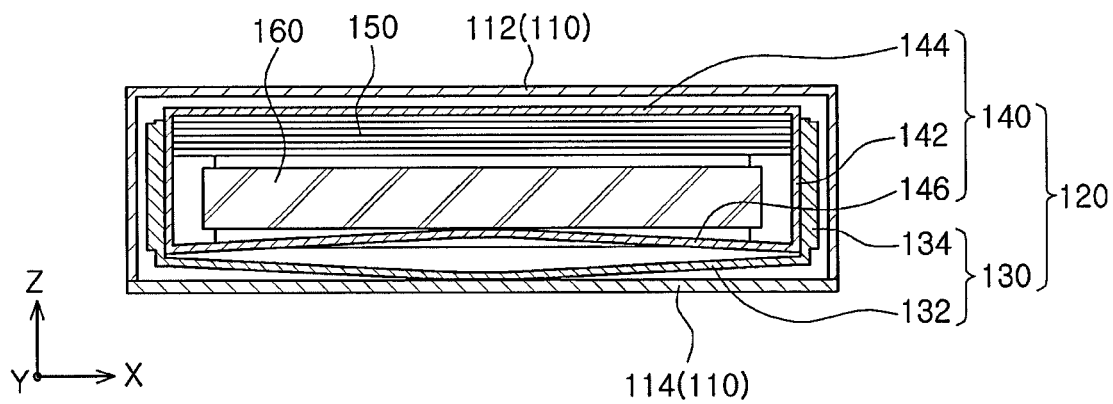
FIG. 3 is a schematic cross-sectional view illustrating the vibrator according to an exemplary embodiment of the present disclosure.

Referring to FIGS. 1 through 3, a vibrator 100 according to an exemplary embodiment of the present disclosure may include a housing 110, an elastic member 120, a piezoelectric element 150, and a weight body 160 by way of example.

Here, terms with respect to directions will be first defined. As seen in FIG. 1, a length direction refers to an X direction, a width direction refers to a Y direction, and a thickness direction refers to a Z direction.

The housing 110 may have an internal space. That is, the housing 110 may have the internal space so that the elastic member 120, the piezoelectric element 150, and the weight body 160 may be disposed therein.

Meanwhile, the housing 110 may include a case 112 and a bracket 114. In addition, the case 112 and the bracket 114 may be provided with protrusion parts 112a and 114a, respectively.

The case 112 may have an opened lower end portion and an internal space. Meanwhile, the case 112 may be provided with the protrusion parts 112 at which both end portions of the elastic member 120 are disposed. The protrusion parts 112a may have a hexahedral shape and may be formed at both sides of the case 112 to form an angle of approximately 180 degrees.

That is, the case 112 may have a coin shape having the protrusion parts 112a. Meanwhile, the case 112 is not limited to the above-mentioned shape, but may also have a cubic shape in which a length thereof is substantially the same as a width thereof (for example, a cubic shape having the protrusion parts 112), or the like.

In addition, the case 112 may form an appearance of the vibrator 100 together with the bracket 114.

The bracket 114 may be coupled to the case 112 and have a shape corresponding to that of the case 112. For example, the bracket 140 may have a plate shape and may be provided with the protrusion parts 114 corresponding to the protrusion parts 112a of the case 112.

In addition, the bracket 114 and the case 112 may be coupled to each other to form a closed space in which the elastic member 120, the piezoelectric element 150, and the weight body 160 may be disposed.

Figure 4:
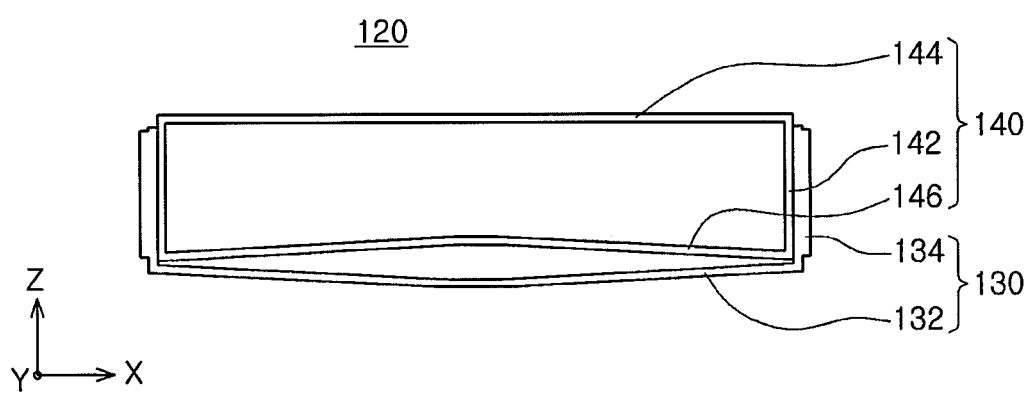
FIG. 4 is a front view illustrating an elastic member included in the vibrator according to an exemplary embodiment of the present disclosure.

The elastic member 120 may include first and second elastic members 130 and 140, as shown in more detail in FIG. 4. Meanwhile, the elastic member 120 may include a housing fixed part 132 fixed to the housing 110, a piezoelectric element mounted part 144 disposed so as to face the housing fixed part 132, and a weight body installed part 146 disposed adjacent to the housing fixed part 132.

Meanwhile, the first elastic member 130 may include the housing fixed part 132 and first deformed parts 134 extended from the housing fixed part 132.

The housing fixed part 132 may have a central portion fixed to the bracket 114 of the housing 110. Meanwhile, the housing fixed part 132 may vibrate vertically in the state in which it is fixed to the bracket 114. In other words, both ends of the housing fixed part 132 may vibrate vertically based on the central portion thereof. To this end, the housing fixed part 132 may have a bent shape.

The first deformed parts 134 may be extended upwardly from both end portions of the housing fixed part 132. That is, the first elastic member 130 may approximately have a "ㄷ" shape when viewed from the front.

The second elastic member 140 may include bonded parts 142 bonded to the first deformed parts 134, the piezoelectric element mounted part 144 extended from one side of the bonded parts 142, and the weight body installed part 146 extended from the other side of the bonded parts 142.

The bonded part 142 may be bonded to the first deformed part 134 and may be deformed in a horizontal direction together with the first deformed part 134 when the piezoelectric element 150 is deformed. In addition, the bonded part 142 may be in an elastically deformed state when the piezoelectric element 150 does not operate. Therefore, the bonded part 142 may move toward the piezoelectric element 150 by restoring force at the time of contraction of the piezoelectric element 150 and may move outwardly from the piezoelectric element 150 at the time of extension of the piezoelectric element 150.

Meanwhile, the piezoelectric element mounted part 144 may be extended from one side of the bonded part 142. That is, the piezoelectric element mounted part 144 may connect the bonded parts 142 contacting both end portions of the piezoelectric element 150 to each other and have the piezoelectric element 150 bonded to a lower surface thereof.

In addition, the weight body installed part 146 may be extended from the other sides of the bonded parts 142 and serve to connect the other sides of the bonded parts 142 to each other, similar to the piezoelectric element mounted part 144.

Further, the weight body installed part 146 may be bent so as to vibrate in a vertical direction when the piezoelectric element 150 is deformed.

In addition, the weight body installed part 146 may contact or be spaced apart from the above-mentioned housing fixed part 132 when it vibrates. That is, the weight body installed part 146 may be extended from the bonded part 142 so as to be disposed over the housing fixed part 132.

In other words, the second elastic member 140 may approximately have a "ㄷ" shape.

As described above, the elastic member 120 including the first and second elastic members 130 and 140 may have a closed curve shape as shown in FIG. 4 when viewed from the front.

In addition, the first and second elastic members 130 and 140 may be formed integrally with each other or manufactured separately from each other and then bonded to each other.

Here, an operation of the elastic member 120 will be schematically described.

First, when the piezoelectric element 150 is deformed in the length direction (X direction in FIG. 2), the bonded parts 142 contacting both end portions of the piezoelectric element 150 may be deformed in the length direction. In this case, the other end of the bonded parts 142 may be further deformed in the length direction as compared with one end of the bonded parts 142 to which the piezoelectric element 150 is bonded.

In other words, the bonded parts 142 may be deformed outwardly from the piezoelectric element 150 in the length direction, and the other end portion of the bonded parts 142 may rotate based on one end portion of the bonded parts 142 contacting both end portions of the piezoelectric element 150. That is, a displacement amount of the other end portion of the bonded parts 142 may be larger than that of one end portion thereof.

At the same time, the first deformed parts 134 to which the bonded parts 142 are bonded may be deformed along with the bonded parts 142.

In addition, the weight body installed part 146 may be deformed in the thickness direction (Z direction in FIG. 2) by the deformation of the bonded part 142. In this case, a displacement amount of the weight body installed part 146 may be larger than that of the bonded part 142.

In other words, the weight body installed part 146 may vibrate due to the deformation of the bonded parts 142. Further, a displacement amount of the weight body installed part 146 in the thickness direction may be larger than that of the bonded part 142.

Therefore, an increase in an amount of vibration due to the deformation of the piezoelectric element 150 may be implemented.

Meanwhile, the first deformed parts 134 may be deformed together with the bonded parts 142, such that the housing fixed part 132 extended from the first deformed parts 134 may also be deformed along with the first deformed parts 134 in the vertical direction (in other words, thickness direction).

The piezoelectric element 150 may be fixed to the piezoelectric element mounted part 144. In addition, the piezoelectric element 150 may have a hexahedral shape.

Meanwhile, the piezoelectric element 150 may be extended or contracted in the length direction, that is, the X direction in FIG. 1, when a voltage is applied thereto.

In addition, both end portions of the piezoelectric element 150 may be closely adhered to the bonded parts 142. Since both end portions of the piezoelectric element 150 are closely adhered to the bonded parts 142, as described above, the bonded parts 142 may be deformed in the length direction by the extension or the contraction of the piezoelectric element 150 in the length direction.

Meanwhile, although not shown in the accompanying drawings, the piezoelectric element 150 may be connected to a circuit board so that external power may be supplied thereto.

In addition, the piezoelectric element 150 may have, for example, a thickness of 0.3 mm to 1 mm, a width of 1 mm to 4 mm, and a length of 5 mm to 15 mm. Further, the piezoelectric element 150 may be formed by stacking a plurality of piezoelectric substance layers.

The weight body 160 may be fixed to the weight body installed part 146. Meanwhile, the weight body 160 may have a coin shape and may have an insertion groove 162 formed in an upper surface thereof, wherein the insertion groove 162 has the piezoelectric element 150 inserted thereinto at the time of generation of vibration.

That is, the weight body 160 may have the insertion groove 162 formed in the upper surface thereof so as to prevent the weight body 160 from contacting the piezoelectric element 150 in the case in which the weight body 160 vibrates together with the weight body installed part 146 by the vibration of the weight body installed part 146.

The insertion groove 162 may have a shape corresponding to that of the piezoelectric element 150.

As described above, the weight body 160 vibrates together with the weight body installed part 146, such that noise may occur due to contact between the weight body 160 and the housing 110 when the weight body 160 vibrates.

In order to prevent the noise due to the contact between the weight body 160 and the housing 110, the weight body 160 or the housing 110 may be provided with a damper member (not shown). The damper member may be formed of an elastic material such as Poron, rubber, or the like. In the case in which the damper member is installed, generation of the noise may be prevented.

Further, the damper member may be installed in the insertion groove 162 in order to prevent damage to the piezoelectric element 150.

As described above, an amount of vibration generated by the deformation of the piezoelectric element 150 may be increased by the elastic member 120 including the first and second elastic members 130 and 140. In other words, the deformation of the piezoelectric element 150 in the length direction may be converted into the vibration thereof in the thickness direction to increase the amount of vibration.

In addition, a length of the vibrator 100 may be decreased by the elastic member 120 having the closed curve shape.

In addition, a structure in which the weight body 160 encloses the piezoelectric element 150 may be adopted so that impact is not directly applied to the piezoelectric element 150 at the time of drop impact, such that the weight body 160 and the housing 110 may first contact each other at the time of drop impact to decrease damage to the piezoelectric element 150.

Further, the piezoelectric element 150 may be disposed in the electric member 120, such that the elastic member 120 may absorb the impact at the time of drop impact to further decrease damage to the piezoelectric element 150.

Further, the piezoelectric element 150 may be disposed at the center and the weight body 160 may be disposed so as to enclose the piezoelectric element 150 to increase a volume of the weight body 160 in a given space, thereby implementing an increase in an amount of vibration due to an increase in mass.

Hereinafter, modified examples of the elastic member included in the vibrator according to an exemplary embodiment of the present disclosure will be described with reference to the accompanying drawings.

Figure 5:
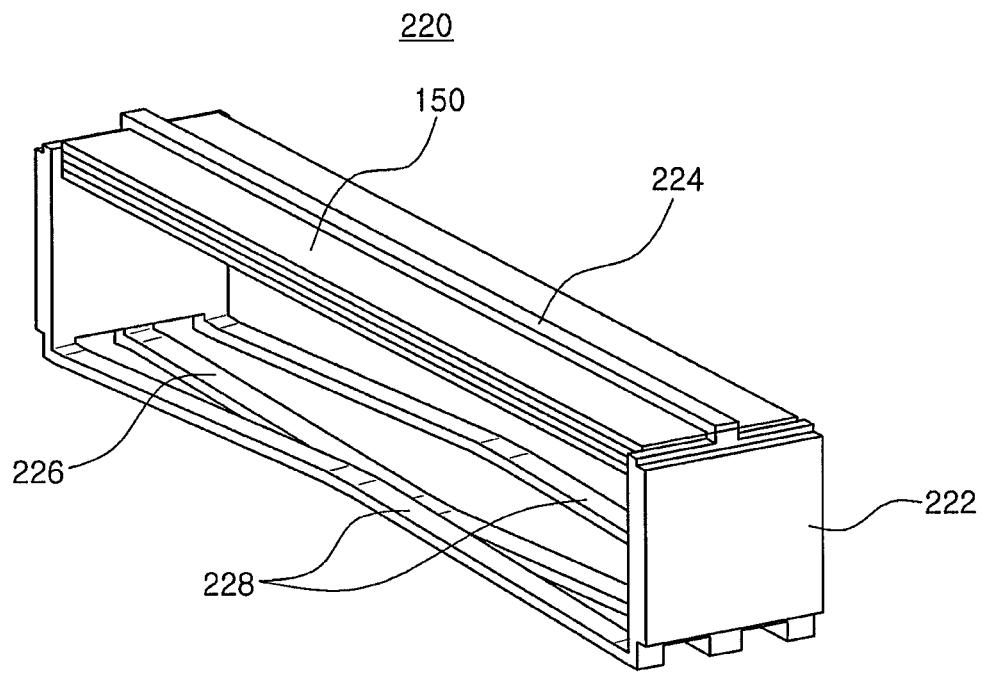
FIG. 5 is a perspective view illustrating a first modified example of the elastic member included in the vibrator according to an exemplary embodiment of the present disclosure.

FIG. 5 is a perspective view illustrating a first modified example of the elastic member included in the vibrator according to an exemplary embodiment of the present disclosure.

An elastic member 220 may include first deformed parts 222, a piezoelectric element mounted part 224, a housing fixed part 226, and weight body fixed parts 228.

Meanwhile, the elastic member 220 may have a closed curve shape when viewed from the front.

The first deformed parts 222 may be closely adhered to both end portions of the piezoelectric element 150 For example, the first deformed parts 222 may be in the state in which they are elastically deformed when the piezoelectric element 150 does not operate.

In addition, the piezoelectric element mounted part 224 may be extended from one end of the first deformed parts 222. Meanwhile, the piezoelectric element mounted part 224 may have the piezoelectric element 150 fixed to a lower surface thereof, as shown in FIG. 5.

Meanwhile, the housing fixed part 226 may be extended from a central portion of the other end of the first deformed parts 222. Further, the housing fixed part 226 may be bent downwardly.

In addition, the weight body fixed parts 228 may be extended from the other end of the first deformed parts 222 so as to be disposed at both sides of the housing fixed part 226.

Further, the weight body fixed parts 228 may be bent upwardly as opposed to the housing fixed part 226.

That is, the elastic member 220 may be formed of a single member.

Figure 6:
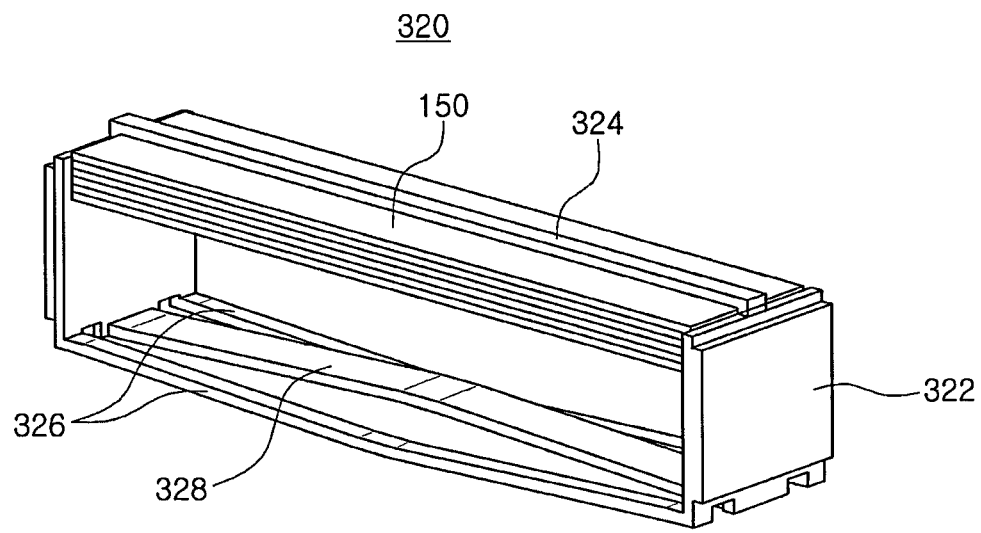
FIG. 6 is a perspective view illustrating a second modified example of the elastic member included in the vibrator according to an exemplary embodiment of the present disclosure.

FIG. 6 is a perspective view illustrating a second modified example of the elastic member included in the vibrator according to an exemplary embodiment of the present disclosure.

An elastic member 320 may include first deformed parts 322, a piezoelectric element mounted part 324, housing fixed parts 326, and a weight body fixed part 328.

Meanwhile, the elastic member 320 may have a closed curve shape when viewed from the front.

The first deformed parts 322 may be closely adhered to both end portions of the piezoelectric element 150. As an example, the first deformed parts 322 may be in the state in which they are elastically deformed when the piezoelectric element 150 does not operate.

In addition, the piezoelectric element mounted part 324 may be extended from one end of the first deformed parts 322. Meanwhile, the piezoelectric element mounted part 324 may have the piezoelectric element 150 fixed to a lower surface thereof, as shown in FIG. 6.

Meanwhile, the housing fixed parts 326 may be extended from the other end of the first deformed parts 322 so as to be disposed at both sides of the weight body fixed part 328. Further, the housing fixed parts 326 may be bent downwardly.

In addition, the weight body fixed part 328 may be extended from a central portion of the other end of the first deformed parts 322 so as to be disposed between the housing fixed parts 326.

Further, the weight body fixed part 328 may be bent upwardly as opposed to the housing fixed parts 326.

In addition, the weight body fixed part 328 may have a width wider than that of the housing fixed part 326 so as to have sufficient coupling force with the weight body 160 (See FIG. 2).

Further, the elastic member 320 may be formed of a single member.

As set forth above, according to exemplary embodiments of the present disclosure, the weight body may be installed in the elastic member, such that the weight body and the piezoelectric element may move together with each other at the time of generation of external impact, thereby preventing damage to the piezoelectric element.

In addition, the weight body may have a structure in which it encloses the piezoelectric element, such that the weight body may contact the housing before the piezoelectric element contacts the housing, thereby preventing damage to the piezoelectric element.

Further, the elastic member having the closed curve shape may absorb external impact at the time of generation of the external impact, thereby further decreasing the damage to the piezoelectric element.

Furthermore, the elastic member may be deformed in the thickness direction due to the deformation of the piezoelectric element in the length direction, thereby increasing an amount of vibration generated.

Meanwhile, the weight body may have a structure in which it encloses the piezoelectric element, such that a volume of the weight body may increase, thereby further increasing the amount of vibration generated.

While exemplary embodiments have been shown and described above, it will be apparent to those skilled in the art that modifications and variations could be made without departing from the spirit and scope of the present disclosure as defined by the appended claims.

What is claimed is:

1. A vibrator comprising:
   a housing having an internal space;
   an elastic member including a housing fixed part fixed to the housing, a piezoelectric element mounted part disposed so as to face the housing fixed part, and a weight body installed part disposed adjacent to the housing fixed part;
   a piezoelectric element fixed to the piezoelectric element mounted part; and
   a weight body fixed to the weight body installed part,
   wherein the elastic member has a closed curve shape, and
   wherein each central portion of the housing fixed part and the weight body installed part is bent in an opposite direction from each other.

2. The vibrator of claim 1, wherein the elastic member includes:
   a first elastic member including the housing fixed part and a first deformed part extended from the housing fixed part; and
   a second elastic member including a bonded part bonded to the first deformed part, the piezoelectric element mounted part extended from one side of the bonded part, and the weight body installed part extended from the other side of the bonded part.

3. The vibrator of claim 2, wherein the first and second elastic members are formed integrally with each other or are formed separately from each other and then bonded to each other.

4. The vibrator of claim 1, wherein the piezoelectric element has a hexahedral shape.

5. The vibrator of claim 1, wherein the housing includes a case having the internal space and a bracket assembled to a lower end portion of the case,
- each of the case and the bracket is provided with protrusion parts at which the piezoelectric element and both end portions of the elastic member are disposed, and
- each of the case and the bracket has a circular shape except for the protrusion parts, when viewed from the top.

6. The vibrator of claim 1, wherein the elastic member further includes first deformed parts contacting both end portions of the piezoelectric element,
- the piezoelectric element mounted part is extended from one end of the first deformed parts, the housing fixed part is extended from a central portion of the other end of the first deformed part, and
- weight body fixed parts are extended from the other end of the first deformed parts so as to be disposed at both sides of the housing fixed part.

7. The vibrator of claim 1, wherein the elastic member further includes first deformed parts contacting both end portions of the piezoelectric element,
- the piezoelectric element mounted part is extended from one end of the first deformed parts,
- a weight body fixed part is extended from a central portion of the other end of the first deformed parts, and
- the housing fixed parts are extended from the other end of the first deformed parts so as to be disposed at both sides of the weight body fixed part.

8. The vibrator of claim 7, wherein the weight body fixed part has a width wider than that of the housing fixed part.

9. A vibrator comprising:
- a housing having an internal space,
- an elastic member including a housing fixed part fixed to the housing, a piezoelectric element mounted part disposed so as to face the housing fixed part, and a weight body installed part disposed adjacent to the housing fixed part;
- a piezoelectric element fixed to the piezoelectric element mounted part; and
- a weight body fixed to the weight body installed part,
- wherein the elastic member has a closed curve shape,
- wherein the weight body has an insertion groove formed in an upper surface thereof and has a coin shape, the insertion groove having the piezoelectric element inserted thereinto at the time of generation of vibration.

10. A vibrator comprising:
- a housing having an internal space;
- a first elastic member including a housing fixed part and a first deformed part extended from the housing fixed part;
- a second elastic member including a bonded part bonded to the first deformed part, a piezoelectric element mounted part extended from one side of the bonded part, and a weight body installed part extended from the other side of the bonded part;
- a piezoelectric element fixed to the piezoelectric element mounted part; and
- a weight body fixed to the weight body installed part,
- wherein the housing fixed part and the weight body installed part contact each other or are spaced apart from each other at the time of generation of vibration, and
- wherein each central portion of the housing fixed part and the weight body installed part is bent in an opposite direction from each other.

* * * * *